United States Patent [19]

Christensen

[11] Patent Number: 5,062,386
[45] Date of Patent: Nov. 5, 1991

[54] INDUCTION HEATED PANCAKE EPITAXIAL REACTOR

[75] Inventor: Robert W. Christensen, Monte Sereno, Calif.

[73] Assignee: Epitaxy Systems, Inc., Santa Clara, Calif.

[21] Appl. No.: 356,293

[22] Filed: May 23, 1989

Related U.S. Application Data

[63] Continuation-in-part of Ser. No. 78,278, Jul. 27, 1987, abandoned.

[51] Int. Cl.$^5$ .............................................. C23C 16/46
[52] U.S. Cl. .................................... 118/725; 118/715; 118/724; 118/733
[58] Field of Search ................ 118/724, 725, 715, 733

[56] References Cited

U.S. PATENT DOCUMENTS 4,641,603  2/1987  Miyazaki et al. .................... 118/724

FOREIGN PATENT DOCUMENTS 61-19119  1/1986  Japan .................................. 118/715

OTHER PUBLICATIONS

Translation of Japanese Kokai Patent Publication No. 61-19119, U.S. Patent and Trademark Office, Sep. 26, 1988.

*Primary Examiner*—Evan Lawrence
*Attorney, Agent, or Firm*—Cushman, Darby & Cushman

[57] ABSTRACT

In an inductively heated pancake epitaxial reactor the reactant gases are fed vertically into a bell jar of reduced height via a plurality of coaxial centrally disposed flow passageways, one of which is outwardly flared to impart a radial component of velocity to one or more of the flows. The density, velocity and composition of the flow streams are separately controlled to control the deposition prameters. A composite R.F. inductive heater coil, made up of vertically stacked tubes, is contained within a purged housing. The turns of the heating coil are variably spaced to obtain a desired spatial distribution of power density coupled into the susceptor. A purged porous member of thermal insulation is disposed in between the R.F. heating coil and the pancake susceptor to reduce heat loss. The bell jar is sealed to its base plate by means of a vacuum pull-down sealing and lifting flange sealed to the bell jar by means of a purged O-ring. The bell jar is cooled by a flow of cooling air flowing in a constant cross-sectional area annulus defined between the bell jar and a surrounding thermal reflector. The bell jar is surrounded by a blast shield coupled to and movable with the bell jar.

22 Claims, 4 Drawing Sheets

INDUCTION HEATED PANCAKE EPITAXIAL REACTOR

Cross-Reference to Related Application

This application is a continuation-in-part of application Ser. No. 07/078,278 filed July 27, 1987, now abandoned.

BACKGROUND OF THE INVENTION

1. Field of the Invention

The present invention relates in general to epitaxial reactors and, more particularly, to an improved induction heated pancake epitaxial reactor suited for chemical vapor deposition of an epitaxial layer of silicon upon a single crystal silicon wafer.

2. Description of the Prior Art

Heretofore, inductively heated pancake epitaxial reactors have been employed for chemical vapor deposition of n or p doped epitaxial layers of silicon upon silicon wafers. Such reactors have commonly employed an annular horizontal susceptor, as of graphite, coated with a protective layer of silicon carbide. The susceptor had an array of recessed pockets in its upper surface to receive the silicon wafers with their major faces, to be processed, lying in the horizontal plane. The susceptor and wafers were heated to a silicon deposition temperature, as of 900° C. to 1200° C. by means of a water cooled R.F. coil disposed below the susceptor and driven with R.F. current.

The susceptor, R.F. coil, and wafers were enclosed in a bell jar system including a quartz bell-shaped cover having a lower outwardly flanged lip which was selectively clamped to an elastomeric sealing ring carried on the upper face of a base plate for partitioning the interior of the bell jar system from the atmosphere of its surrounds. Reactant gases were fed at relatively high velocity into the bell jar through a vertical quartz tube centrally and coaxially disposed of the susceptor. The bell-shaped cover had a length greater than its diameter with a preponderance of its length protruding above the wafers as supported on the susceptor so that the vertically directed reactant gases at high velocity could impact upon the hemispherical end of the bell jar to mix thoroughly in a mixing zone above a deposition zone proximate the wafers. Spent reactant gasses were exhausted from the deposition and mixing zones of the bell jar system downwardly around the outer periphery of the susceptor.

Some of the problems encountered in such a prior art epitaxial reactor include: (1) slip was produced in crystalline wafers because of an excessive radial thermal gradient in the wafers caused by convective and conductive heat transfer to the silicon wafers and due to loss of thermal radiant energy from the susceptor and wafers to the surrounds of the bell jar; (2) the wafers were auto-doped by out diffusion of dopant and release of dopant by HCl etch from the wafers to the relatively high velocity turbulent reactant gases followed by incorporation of the dopant back into the deposited epitaxial layer; (3) silicon was deposited from the high velocity reactant gases onto the inside surface of the quartz bell jar cover, which deposits flaked off as particulates to contaminate the wafers and to require frequent cleaning of the bell jar cover; (4) the water cooled R.F. induction coil was disposed in gas communication with the reactant gases and $SiO_2$ was deposited upon the coil structure requiring frequent cleanings; (5) the water cooled R.F. coil was disposed in substantial heat exchanging relation with the heated susceptor resulting in a substantial loss of heat to the coil and its coolant thereby increasing the operating R.F. power requirements of the reactor; (6) the sealing flange at the lip of the bell jar cover was expensive to fabricate and often failed under stress from the mechanical clamps used to force the gas-tight seal between the flange and the base plate; (7) the R.F. coil was of square cross-sectional area making it difficult to adjust the turn spacing to vary the spatial distribution of R.F. power density coupled into the susceptor to obtain uniform heating of the susceptor; and (8) the operator was not properly shielded from the flying debris resulting from a catastrophic failure (explosion) of the bell jar cover.

A conventional prior art inductively heated pancake susceptor epitaxial reactor is disclosed in a text entitled: "Silicon Processing for the VLSI Era", published in 1986 by Lattice Press of Sunset Beach, Calif., pages 145-147.

SUMMARY OF THE INVENTION

The principal object of the present invention is the provision of an improved inductively heated pancake susceptor epitaxial reactor.

In one feature of the present invention, the reactant gases are fed into the bell jar in a plurality of vertically directed relatively low velocity flow streams, each separately controlled as to flow rate, composition, velocity, and density to obtain improved control over the epitaxial deposition process.

In another feature of the present invention, at least one of the reactant gas flow streams is deflected radially at its point of entry into the bell jar so as to impart a substantial radial velocity component to the flow of reactant gas in the deposition zone to reduce auto doping and to obtain improved control over the deposition conditions.

In another feature of the present invention, the water cooled R.F. induction heating coil is enclosed in a coil housing and purged at a slight positive gas pressure relative to that in the deposition zone with a gas free of the epitaxial deposition components to inhibit deposition of material on the coil structure.

In another feature of the instant invention, an outlet is provided from the coil housing to enable purge gas within the same to escape, which outlet is dimensioned to permit viscous flow of the purge gas therethrough greater than or equal to diffusion flow therethrough of reactant gases.

In another feature of the present invention, a thermally insulative member of refractory insulation is disposed intermediate the water cooled R.F. heating coil and the susceptor to reduce heat loss from the susceptor to the R.F. heating coil and its coolant, thereby reducing the power consumption of the reactor.

In another feature of the present invention, the member of the thermal insulation is enclosed in a housing and purged with gas free of epitaxial deposition components to inhibit the release of unwanted gaseous constituents into the atmosphere of the deposition zone.

In another feature of the present invention, the R.F. induction heating coil comprises a plurality of tubular conduits vertically stacked, one above the other, to define, in each turn of the coil, a composite electrical conductor of vertically elongated transverse cross-sectional area, whereby adjacent turns of the coil can be more closely spaced and coolant pressure cycled without producing excessive mechanical fatigue and eventual failure of the coil.

In another feature of the present invention, the adjacent turns of the R.F. induction heating coil are more closely spaced proximate the outer periphery of the coil to increase the power density coupled into the susceptor at its periphery to offset convective and radiant thermal loss at the outer periphery of the susceptor.

In another feature of the present invention, the lower lip of the bell jar cover is sealed to the base plate by a sealing flange structure including a compressible ring compressed radially into a gas-tight sealing engagement with the outer periphery of the bell jar cover for mechanically coupling the bell jar cover to the sealing flange, thereby reducing the fabrication cost of the bell jar cover and its sealing flange.

In another feature of the present invention, the sealing flange system for sealing the bell jar cover to the base plate includes an evacuable recess between the flange and the base plate for selective evacuation to subatmospheric pressure so as to cause the flange and base plate to be compressed into gastight sealing engagement.

In another feature of the present invention, the compressible sealing ring for sealing the bell jar cover to the base plate is purged with purge gas flowing radially inwardly of the sealing ring and into the bell jar.

In another feature of the present invention, a bell-shaped thermal radiant energy reflector is coaxially disposed in radially outwardly spaced relation from the bell jar cover for reflecting thermal radiant energy emanating from the susceptor back to the susceptor to reduce thermal gradients over the susceptor.

In another feature of the present invention, an annular air cooling duct is defined in the annular space between the bell jar cover and surrounding bell-shaped thermal reflector with the cross-sectional area of the air cooling duct having generally uniform area as a function of axial length, whereby coolant flow separation and turbulent flow conditions are avoided to enhance uniform cooling of the bell jar cover.

In another feature of the present invention, a plurality of radially spaced coaxial cylindrical vanes are disposed in a central aperture at the top of the bell-shaped thermal reflector and facing into the air cooling annulus between the reflector and the bell jar cover to reflect thermal radiant energy emanating from the susceptor back to the susceptor to reduce thermal gradients in the heated susceptor.

In another feature of the present invention, the bell jar cover has a diameter at its open end greater than its axial length to reduce the volume of the bell jar system and to effectuate economies in consumption of power and reactant and purge gases.

In another feature of the present invention, the closed upper end wall of the bell jar cover is concave having a maximum radius of curvature in excess of the axial length of the cover to reduce the volume of the bell jar and to effectuate economies in consumption of power and reactant and purge gases.

In another feature of the present invention, a mechanical shield member is disposed surrounding and movable with the bell jar cover for catching and shielding the operator from flying debris emanating from a catastrophic failure of the bell jar cover.

In another feature of the present invention, an alternative inductive coil structure is provided, which coil includes solid material with adjacent turns of the same dimensioned and/or spaced from one another to provide a desired magnetic field to induce a more uniform temperature gradient in wafers to be heated.

Other features and advantages of the present invention will become apparent upon a perusal of the following specification taken in connection with the accompanying drawings wherein:

DESCRIPTION OF THE PREFERRED EMBODIMENTS

Figures 1, 8:
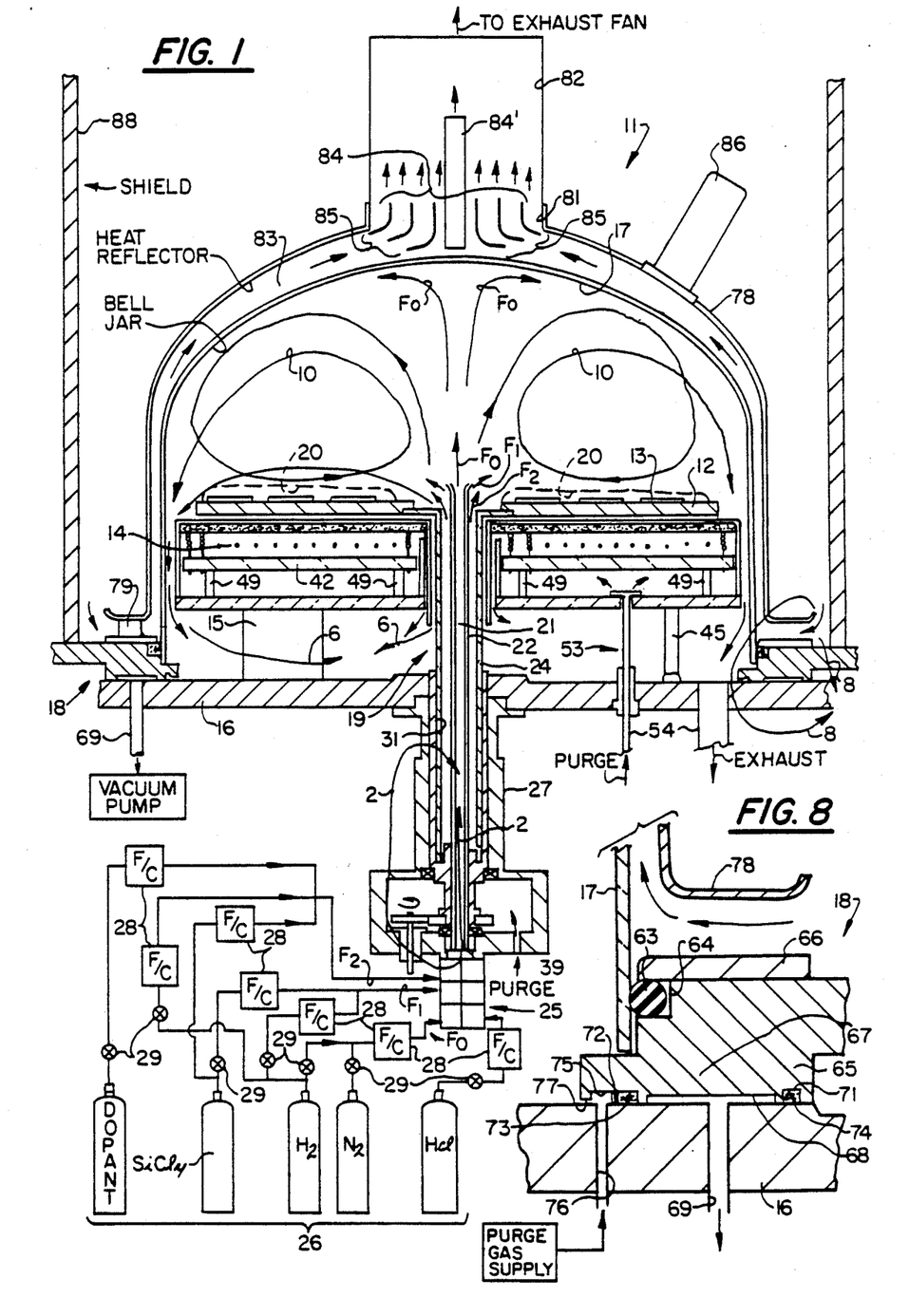
FIG. 1 is a longitudinal sectional view of an epitaxial reactor incorporating features of the present invention.
FIG. 8 is an enlarged detail view of a portion of the structure of FIG. 1 delineated by line 8—8.
Figures 2, 3, 4, 5:
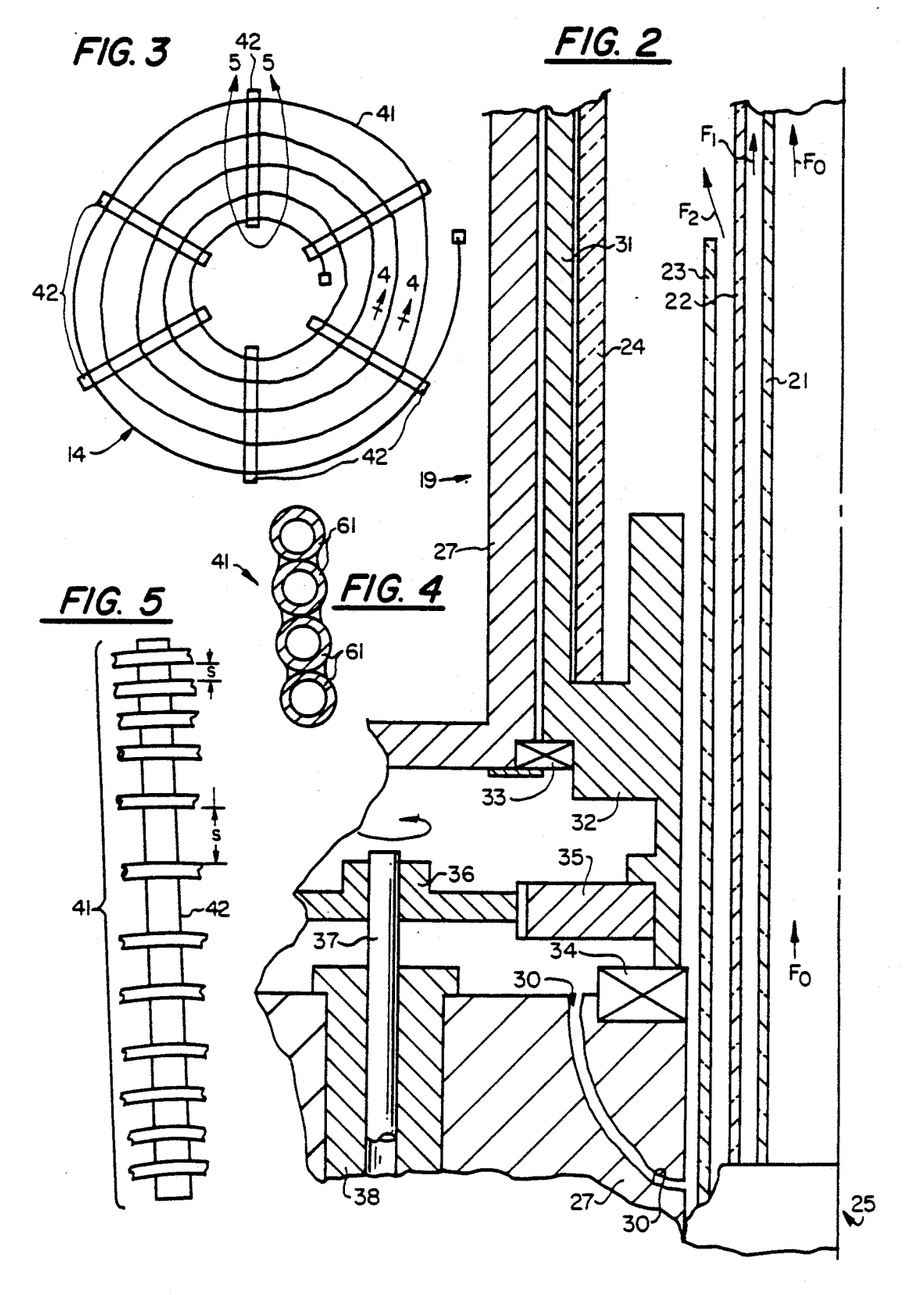
FIG. 2 is an enlarged sectional view of a portion of the structure of FIG. 1 delineated by a line 2—2.
FIG. 3 is a schematic plan view of the induction heating coil of the present invention.
FIG. 4 is an enlarged sectional view of the structure of FIG. 3 taken along line 4—4 in the direction of the arrows.
FIG. 5 is an enlarged detail view of a portion of the structure of FIG. 3 delineated by line 5—5.

Referring now to FIGS. 1 and 2, there is shown an inductively heated pancake epitaxial reactor 11 incorporating features of the present invention. The epitaxial reactor 11 includes an annular pancake susceptor 12 as of ultra pure graphite coated with a protective layer of silicon carbide. The annular susceptor 12 includes recesses at its upper horizontal major face to receive a plurality of silicon wafers 13 to be processed. The silicon wafers are held in the recesses with their major faces disposed substantially in the horizontal plane.

An inductive heating coil 14 is disposed below the susceptor 12 and in magnetic field exchanging relation with the susceptor 12 for heating the susceptor and the wafers 13 to the desired epitaxial deposition temperature. Radio frequency current is supplied to the inductive heating coil 14 via the intermediary of an R.F. feedthrough 15 passing R.F. leads through a base plate 16 to an R.F. power supply, not shown.

A bell jar cover 17, as of quartz, is selectively sealed to the base plate 16 via the intermediary of a sealing flange assembly 18 for partitioning the atmosphere inside the bell jar and in a deposition zone 20 overlaying the wafers 13 from the atmosphere external to the bell jar 17.

Reactant gas distribution system 19 is coaxially and centrally disposed of the annular susceptor 12 for feeding the reactant gases, in a vertical direction, into the bell jar 17 and into the deposition zone 20.

The gas distribution system 19 includes a plurality of coaxial quartz tubes 21, 22, 23 and 24 for partitioning the flow of reactant gases into three separately controllable flow streams $F_0$, $F_1$ and $F_2$ flowing vertically into the bell jar cover 17.

The various reactant gases are fed into the respective flow streams $F_0$, $F_1$ and $F_2$ by means of a gas manifold 25 disposed at the lower extremity of the concentric coaxial tubes, 21, 22 and 23. The manifold 25 includes a number of ports for induction of the various reactant gases from gas supplies 26. The manifold forms a portion of and is carried from the lower extremity of a dependent portion of the bell jar housing 27 carried from and sealed to a central aperture in the base plate 16.

In a typical example, the gas supplies 26 include: a silicon-bearing reactant gas such as silicon tetrachloride; hydrogen; nitrogen; a suitable dopant gas such as diborane, arsene, phosphine, etc.; and a supply of etchant gas such as hydrogen chloride. The various gas supplies 26 are connected in gas communication with corresponding ports of the manifold 25 via the intermediary of gas tubing, valves 29 and various flow controllers 28. In a typical example, the central flow stream $F_0$ is made up of either hydrogen or nitrogen depending upon whether the system is being purged or wether it is being operated in the deposition mode. In the deposition mode the flow stream $F_0$ comprises a flow of hydrogen. Flow stream $F_1$ is made up of a flow of hydrogen plus a flow of siliconcontaining reactant gas such as silicon tetrachloride, whereas the third flow stream $F_2$ is made up of a flow of hydrogen plus silicon tetrachloride plus dopant. The three flow streams, $F_0$, $F_1$ and $F_2$ are separately controllable as to velocity, flow rate, density and composition by means of the settings of the various valves 29 and flow controllers 28 to obtain control over the deposition conditions within the deposition zone 20 for depositing the epitaxial layer upon the wafers 13. The upper end of the central quartz tube 21 is outwardly flared at its upper end in a region overhanging the outlet of the second flow passageway $F_1$ for imparting a substantial radial component to the velocity of the flow stream $F_1$ exiting from the gas distribution system 19 into the deposition zone 20. The composite flow of reactant gas is as generally indicated by flow arrows 10.

The susceptor 12 is rotated about its axis of revolution by means of dependent quartz tube 24 coaxially received within a metallic sleeve 31, as of stainless steel, carried from a hub member 32 bearing upon bearings 33 and 34 and carried from the inside wall of the dependent housing 27. The hub 32 includes a spur gear 35 mating with a second spur gear 36 driven by a rotatable shaft 37 hermetically sealed to the housing 27 by means of a ferrofluidic sealed bearing 38 passing through the housing 27 in a gas-tight manner. The annular susceptor rests, at its inner periphery, by gravitational force upon the outwardly flared upper extremity of the quartz tube 24. The gear housing portion of the dependent housing 27 is purged with a purge gas such as hydrogen during deposition or nitrogen during non-deposition through a purge line 39. The purge gas entering the housing 27 at 39 is connected via a gas communication passageway 30 communicating with the flow passageway $F_2$.

During deposition, the central vertically directed flow stream $F_0$ impacts upon the center of the bell-shaped cover 17 and is deflected downwardly and radially outwardly along the inside wall of the bell jar cover 17. In the deposition mode, the center flow stream $F_0$ is free of the silicon deposition component so as to buffer the inside wall from the deposition component and, thus, to inhibit formation of silicon deposits on the inside wall of the bell jar cover 17.

Figure 6:
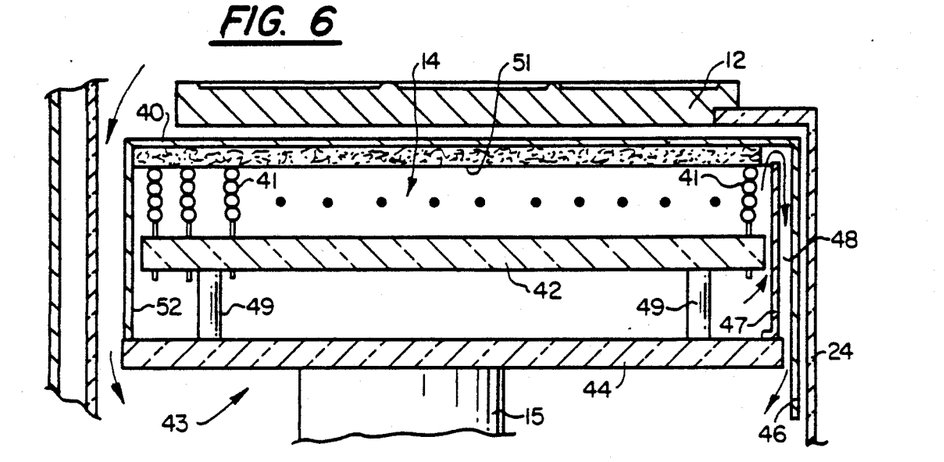
FIG. 6 is an enlarged sectional view of a portion of the structure of FIG. 1 delineated by line 6—6.

Referring now to FIGS. 1, 3 and 6, the inductive heating structure is shown in greater detail. More particularly, the R.F. induction coil structure 14 includes a water cooled spiral electrically conductive coil 41 supported upon a plurality of radially directed refractory dielectric rods 42 as of quartz. The coil 41 is contained within a donut-shaped housing or enclosure 43 including an annular disk-shaped base plate member 44 of a refractory dielectric material such as quartz supported from the base plate 16 of the bell jar system via the intermediary of a plurality of standoffs 45. An inverted cake-pan shaped refractory dielectric cover 40 as of quartz is supported at its outer periphery from the outer periphery of the base plate 44 and includes an inner annular dependent lip portion 46 radially inwardly spaced from the inner periphery of the base plate 44. Upstanding tubular refractory dielectric member 47, as of quartz, is coaxially disposed interiorly of the dependent tubular wall 46 to define an annular gas passageway 48 therebetween. The coil support rods 42 are supported from the base plate 44 via the intermediary of a plurality of refractory dielectric standoffs 49.

A blanket of fibrous or foamed ceramic, refractory thermally insulative material 51 is supported upon the upper surface of the coil 41 and interposed between the coil 41 and the top cover portion 45 of the coil housing 43 for thermally insulating the coil 41 from the susceptor 12. A ground fit is obtained between the base plate 44 and the outer dependent annular wall portion 52 of the top cover 45 of the coil housing 43. Purge gas such as hydrogen or nitrogen, depending upon whether deposition is occurring, is fed into the coil housing 43 via a hermetically sealed tubulation 53 passing through the base plate 16 and through an aperture in the bottom wall 44 of the coil housing 43.

Purge gas entering the coil housing 43 places the coil housing at a slight positive pressure relative to the pressure in the remaining portion of the bell jar. The purge gas exits the coil housing 43 via the annular passageway 48 connected in gas communication with the interior of the coil housing 43 via the annular spacing between the upper end of the tubular wall portion 47 and the top cover 40.

Although at first blush it would appear that passageway 48 should be restricted in size to the extent practical in order to minimize escape of purge gas, it has been found that its size should be larger to optimize the effectiveness of the purging system. That is, it is known that the purge gas leaks from the coil housing through the passageway 48 by viscous flow whereas reactant gases enter the housing through such passageway by diffusion. The rate of diffusion flow varies linearly or as the square of at least one variable determined by the geometric size of the passageway, whereas viscous flow through the passageway varies linearly with the cube of at least one of the passageway dimensions. This implies that the ratio between purge gas leaving the housing and reactant gas entering the same increases as the passageway 48 is restricted. In other words, as the passageway is made smaller and smaller the diffusion of reactant gases out of the passageway overcomes the viscous flow, resulting in the undesired contamination. This is quite unexpected and contrary to what seems logical. This is taken care of in the instant invention by computing the size of the passageway to allow viscous flow of purge gas from the same which is at least greater than or equal to the diffusion flow through such passage way. In this particular embodiment, a passageway having a width dimension of approximately 0.006 inches has been found to be satisfactory, and it has been experimentally found that no evidence of reactant gases entering the housing can be observed when the passageway has such dimensions.

The purge gas exiting the coil housing 43 is downwardly directed below the coil housing so as to exhaust the bell jar via an exhaust tubulation 54 passing through the base plate 16. In this manner, the coil purge gas does not exit in the region between the susceptor and the coil housing 43, thereby avoiding convective heat transfer and, thus, associated thermal gradients in the susceptor 12 and wafers carried thereon. Moreover, this also avoids a flow of superheated hydrogen which can decompose the silicon-containing gas causing unwanted silicon deposits and particulates. Also, possible contamination products effusing from the thermally insulative blanket 51 are not carried into the deposition zone to contaminate the epitaxial layer grown upon the wafers 13. The purge gas fed into the coil housing prevents deposition of epitaxial film materials on the R.F. induction coil and on the thermally insulative blanket 51 during the deposition process.

Figure 7:
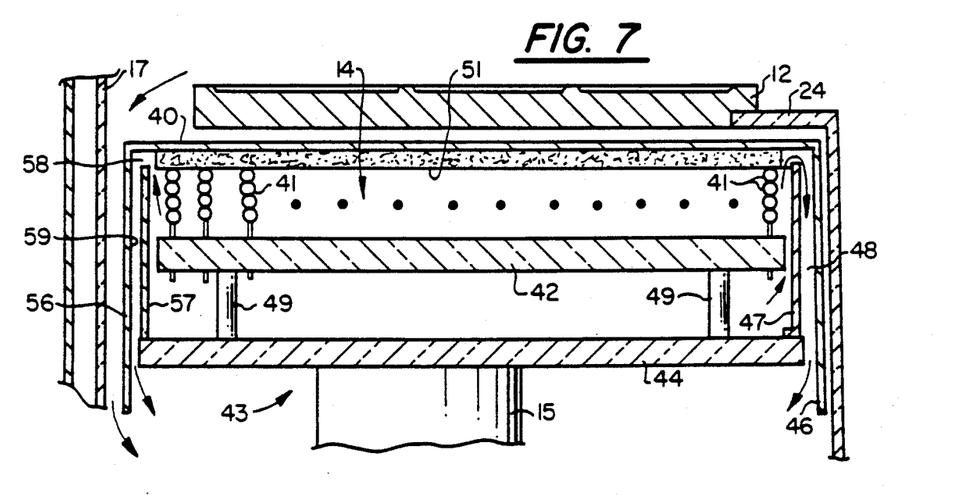
FIG. 7 is a view similar to that of FIG. 6 depicting an alternative embodiment of the present invention.

Referring now to FIG. 7, there is shown an alternative embodiment of the coil housing structure 43 of FIG. 6. In the embodiment of FIG. 7, the top cover portion 40 of the coil housing 43 has its outer dependent tubular wall portion 56 outwardly spaced from the outer periphery of the base plate 44 and depending below the base plate 44. In addition an upstanding tubular wall portion 57 is upstanding from and supported from the outer periphery of the base plate 44 and spaced at its upper lip at 58 from the top cover portion 40 to allow the top cover portion 40 to rest upon the thermally insulative blanket 51 while permitting the flow of purge gas over the wall 57 and into annular flow passageway 59 defined between wall portions 56 and 57 of the housing 43. As in the embodiment of FIG. 6, the size of the passageway through which the purge gas escapes is optimized to make sure that the viscous flow through the same is greater than or equal to diffusion through the same of reactant gases. The flow passageway 59 directs the purge gas exiting the housing 43 at the outer periphery downwardly of the base plate 44 to the exhaust 54 so as to inhibit back diffusion or backstreaming of contaminants carried in the purge gas into the deposition zone 20. This also prevents the purge gas exhausting the coil housing 43 from introducing convective heat transfer to the susceptor 12.

Referring now to FIGS. 3, 4 and 5, the radio frequency inductive heating coil structure 41 is shown in greater detail. More particularly, each turn of the inductive heating coil is made up of a plurality of vertically stacked electrically conductive tubular conduits 61 as of ¼" copper tubing silver soldered together to bond the tubes 61 into the composite coil structure 41 wherein the transverse cross-sectional area of each turn is elongated in the vertical direction. Liquid coolant such as deionized water is fed through the conduits 61 in parallel for cooling of the R.F. induction heating coil 41 in use. By elongating the cross-sectional area of the coil structure 41, adjacent turns of the coil structure may be more closely spaced for a given cross-sectional area of each turn of the coil. This facilitates varying of the radial coil spacing between adjacent turns to allow the coil turns to be more closely spaced near the outer and inner peripheries of the susceptor to increase the heating power density transferred to the susceptor to offset convective heat transfer losses from the susceptor in use. In a typical example, the R.F. coil is cooled by a flow of coolant in the range of three to four gallons per minute flowing through the tubular conduits 61 when the coil is energized with electrical current in the range of 12 to 15 KV a.c. at 300 to 200 KHz. In a typical example, the radial spacing at the outer periphery is on the order of ⅜ of an inch whereas in the center of the coil the radial spacing S' is ⅛ of an inch.

Referring now to FIGS. 1 and 8, the sealing flange assembly 18 is shown in greater detail. More particularly, the sealing flange assembly 18 is mechanically coupled to the outer lip of the bell jar cover 17 at its open end by means of a compressible elastomeric O-ring 63. The O-ring 63 is retained within an annular recess 64 of a metallic sealing and lifting ring 65. A clamping ring 66 overlays the recess 64 and elastomeric O-ring 63 and serves to clamp the ring 63 and to compress the ring into gas-tight sealing engagement at its inner periphery with the outer periphery of the bell jar cover member 17. In addition to making a gas-tight seal between the ring 65 and the bell jar cover 17, the compressed sealing ring 63 also provides a mechanical coupling of the sealing ring 65 to the bell jar cover 17 so that the bell jar moves with movement of the sealing and lifting ring 65. Outwardly extending portions of the sealing ring 65 are coupled to a hydraulic lift for lifting the bell jar cover 17 from the fixed base plate 16 in order to access the susceptor 12 for loading and unloading wafers 13. The clamping ring 66 is held in clamping relation to the lifting and sealing ring 65 by means of a plurality of screws, not shown.

A lower foot portion 67 of the sealing and lifting ring 65 is made of a relatively high strength material such as stainless steel and is annularly recessed at 68 to define an evacuable space between the foot portion 67 of the sealing ring 65 and the upper surface of the base plate 16. Evacuable recess 68 is evacuated by means of an exhaust port 69 passing through the base plate 16 and connecting in gas communication with the annular recess 68. A pair of annular recesses 71 and 72 are provided at the inner and outer periphery of the sealing recess 68 to receive compressible elastomeric O-rings 73 and 74, respectively, for sealing the inner and outer periphery of the evacuable recess 68 to the base plate 16 in a gas-tight manner.

The bell jar cover 17 is clamped into gas-tight sealing relation with the base plate portion 16 of the bell jar system by drawing a vacuum on the annular evacuable recess 68 via exhaust tubulation 69 thereby causing atmospheric pressure on the sealing and lifting ring 65 to press the sealing ring into gas-tight sealing relationship with the base plate 16 via the intermediary of the compressible sealing rings 73 and 74.

An annular gas purge recess 75 is provided in the foot portion 67 of the sealing ring 65 which faces the base plate 16. The gas purge recess 75 is disposed at the inner periphery of the sealing ring 73 and includes a plurality of purge gas ports 76 passing through the base plate 16 in gas communication with the purge gas recess 75. Purge gas such as hydrogen or nitrogen is fed through the gas passageways 76 into the purge recess 75 for maintaining the purge recess at a positive gas pressure relative to the pressure within the bell jar 17. The purge recess 75 is exhausted into the bell jar by means of an annular gas passageway 77 communicating between the interior of the bell jar 17 and the gas purge recess 75. The flow of purge gas outwardly of the annular recess 75 prevents backstreaming of contaminants and epitaxial material bearing reactant gases into the region of the sealing ring 73 so as to maintain the sealing ring 73 in a clean condition thereby assuring that a good gas-tight seal is obtained at the sealing ring 73 and to reduce maintenance of the sealing rings. The purge gas comprises hydrogen during the deposition process and nitrogen while the system is closed but deposition is not occurring.

A bell-shaped heat reflector 78 is coaxially disposed surrounding the bell jar cover 17 and is carried from the sealing ring structure 18 via the intermediary of a plurality of standoff blocks 79 disposed between the clamping ring 66 and the outwardly flared lip of the heat reflector 78. The heat reflector 78 is formed by a spun sheet of a highly electrically conductive material such as aluminum or copper coated on its interior surface with a thermal energy reflective coating as of gold to a thickness as of 1 mil. deposited over a base coating of Ni. The heat reflector 78 includes a central aperture 81 at its top connected to an exhaust tubulation 82. The outside surfaces of the exhaust tubulation 82 and heat reflector 78 are coated with a thermally emissive coating as of black paint for radiating thermal energy absorbed by the heat reflector and exhaust tubulation 82 to its surrounds. An exhaust fan, not shown, is coupled to the exhaust tubulation 82 for drawing air coolant through the annulus 83 defined between the bell jar cover 17 and the heat reflector 78. The annulus 83 is dimensioned in cross-sectional area as a function of the axial length of the annulus so that its crosssectional area remains constant from the lip portion of the heat reflector 78 to the exhaust conduit 82. With the cross-sectional area of the annulus 83 held relatively constant as a function of its length, the flow separation and turbulent flow of the air coolant within the annulus is inhibited in use.

In addition, a plurality of coaxial cylindrical vanes 84 are coaxially disposed in radially spaced relation within the opening 81 in the top of the heat reflector 78. The cylindrical vanes 84 include outwardly flared lower flange portions 85 facing into the cooling annulus 83 for directing the flow into the exhaust tubulation 82 in such a manner as to avoid flow separation, eddies and turbulence. In addition, the centermost cylindrical vane 84 extends at its lower extremity into closely spaced relation to the top centermost portion of the bell jar cover 17 so as to pick up and cause a flow of coolant across the exact top center of the bell jar thereby preventing the formation of a hot spot at that point.

The vanes 84 are coated with a thermal radiant energy reflective material such as gold to reflect radiant energy emanating from the susceptor 12 back to the susceptor to prevent the loss of radiant energy out through the exhaust tubulation 82.

An infrared pyrometer 86 is carried from the heat reflector 78 and measures the temperature of the susceptor 12 by sensing infrared radiation emanating from the susceptor 12 and passing through the infrared transparent bell jar 17 to the pyrometer 86 via a small port in the heat reflector 78.

The flow of air coolant through the cooling annulus 83 serves to cool the bell jar cover 17 to prevent the thermal decomposition of reactive epitaxial material species on the interior surface of the bell jar. The heat reflector 78 serves to reflect the thermal radiant energy emanating from the susceptor 12 back to the susceptor to minimize loss of heat from the susceptor and thermal gradients in the susceptor and wafers 13 resulting from such loss of heat.

A cylindrical metal shield 88 is coaxially disposed of the bell jar and carried at its lower extremity from the sealing flange 18 to catch flying debris emanating from the bell jar cover 18 in the case of a catastrophic failure of said bell jar 17. In this manner the shield 88 protects the operator at all times since the bell jar is always surrounded by the shield 88 and is moveable with the bell jar cover 17.

Figure 9:
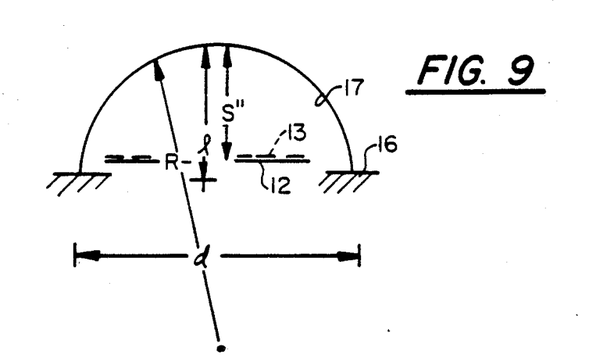
FIG. 9 is a schematic line diagram of a bell jar cover incorporating features of the present invention.

Referring now to FIGS. 1 and 9, the proportions of the bell jar cover 17 are shown in greater detail. More particularly, in a preferred embodiment, the bell jar cover has a diameter d at its open end which is greater than its axial length l whereby the volume of the bell jar is reduced to facilitate economies in consumption of power and reactant and purge gases.

In addition, the closed end of the bell-shaped cover 17 is generally elliptical in shape which, when approximated by a best-fit spherical surface, has a radius of curvature R greater than the axial length l of the bell jar cover to facilitate reflection of thermal energy emanating from the susceptor 12 back to the susceptor and wafers to eliminate thermal gradients associated with heat loss and to substantially reduce, when contrasted with the prior art, the volume of the bell jar system to effectuate economies in consumption of reactant and purge gases as well as power. In a preferred embodiment, the spacing S'' between the end wall of the bell jar and the susceptor is less than one-half the diameter of the bell jar at its open end to further assist in effectuating the aforementioned economies in consumption of power and gas. In operation, the bell jar 17 may be operated at atmospheric pressure or at subatmospheric pressure, the latter condition assisting in inhibiting autodoping effects in the formation of the epitaxial layer on the wafers 13.

In a typical physical realization of the epitaxial reactor system 11, the bell jar cover 17 has an inside diameter at its lip of 27'', is made of quartz and has a wall thickness of 0.250''. The bell jar cover 17 has an axial length l of 18'', a spacing S'' above the susceptor of 11''. The susceptor 12 has an outside diameter of 24'' and a thickness of 9/16''. The inductive heating coil housing 43 has a base plate 44 of quartz having a thickness of ⅜'' whereas the top cover portion 40 is quartz and has a thickness of 0.125''. The blanket of thermal insulation 51 has a thickness falling within the range of ¼'' to 3/8'', is made of refractory fibrous silicon dioxide and the blanket has a density of 3 to 20 and preferably 6 pounds per cubic foot and is commercially available as Q-Felt from John Mansville. The quartz flow tubes 21, 22 and 24 have inside diameters of 0.5'', 0.75'' and 1.625'', respectively. The inside flow tube 21 has a maximum inside diameter at its flared end of 1.125''. The thermal reflector 78 is radially spaced at its open end from the outside of the bell jar by 0.375''.

In a typical silicon epitaxial deposition process, the susceptor 12 is loaded with 40 3'' wafers, 22 4'' wafers or 8 6'' wafers. The bell jar system is purged with approximately 100 liters per minute of nitrogen for five minutes. Thereafter, the bell jar is purged with approximately 100 liters per minute of hydrogen for two to three minutes. Thereafter, the R.F. generator is turned on to excite the R.F. induction heating coil 41 while leaving the hydrogen purge on for the rest of the process. The susceptor is then brought up to operating temperature of approximately 1100° to 1150° C. Hydrogen chloride gas is then injected into the hydrogen purge stream to etch the silicon wafers to remove approximately 0.25 μm to 1.5 μm of silicon. The etch time is approximately 5 minutes. Thereafter, the system is purged with hydrogen for one to two minutes to clear out the hydrogen chloride. Thereafter, silicon dichlorosilane, trichlorosilane or tetrachloride is injected into the hydrogen stream and a dopant gas such as phosphine, arsine or diborane is injected to grow an epitaxial layer of silicon on the wafers 13 to a desired thickness as of 2 to 200 μm at a rate of approximately 0.5 μm per minute to 2.0 μm per minute. Thereafter the silicon bearing gas constituent and the dopant constituent are turned off and the system purged in hydrogen for one to two minutes. Next, the R.F. generator is turned off while the hydrogen gas purge continues. When the temperature of the susceptor drops to approximately 500° C., the hydrogen purge gas is turned off and nitrogen purge gas is turned on for three minutes. Thereafter, the bell jar system is opened by lifting the bell jar off the base plate by means of the lifting and sealing flange 18 for accessing the processed wafers 13.

In the preceding example, the R.F. coil housing is also purged, in a manner similar to that of the bell jar, except that the coil purge gas flow is switched from $N_2$ to $H_2$ a minute or two before the bell jar purge is switched from $N_2$ to $H_2$. Conversely, the coil purge gas flow is switched from $H_2$ to $N_2$ a minute or two after the bell jar purge is switched from $H_2$ to $N_2$.

In the afore cited epitaxial process, the $F_0$ flow is approximately 9.8 liters per minute of hydrogen having a density of approximately $0.09 \times 10^{-3}$ grams per cubic centimeter; the $F_1$ flow comprises 20.8 liters per minute of hydrogen plus 18.6 liters per minute of 25% silicon trichlorosilane plus hydrogen to deliver a total $F_1$ flow of 39.4 liters per minute of gas having a density of $0.9 \times 10^{-3}$ grams per cubic centimeter; and the $F_2$ flow comprises 15 liters per minute of hydrogen plus 1.8 liters per minute of 25% silicon trichlorosilane plus hydrogen for a total flow of 16.8 liters per minute having a density of $0.27 \times 10^{-3}$ grams per cubic centimeter. The dopant, such as phosphine is injected into the $F_2$ flow. The resultant epitaxial layer has a resistivity of 6.2 ohm centimeters, is n-type and the resistivity has a uniformity discrepancy, wafer-to-wafer, of less than, plus or minus 8.6%. The thickness of the resultant epitaxial layer after twelve minutes of deposition is 16 μm plus or minus 6.5% for 4" wafers.

Note that in the purged regions, such as the coil housing 43, gear housing 27 and sealing ring recess 75, the purged region is exhausted at the lowest point in the housing and that portion of the purged housing above is substantially free of leaks so that more dense gases, such as the epitaxial material bearing gaseous constituents, do not flow by gravity into the purged regions.

Figure 10:
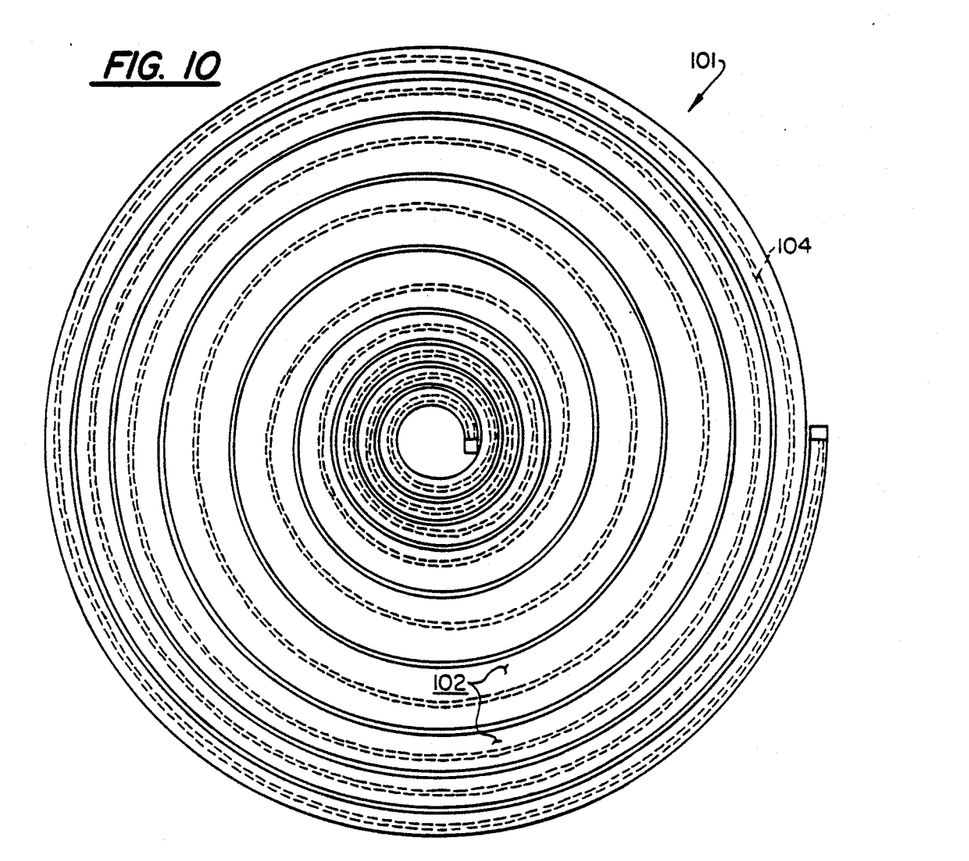
FIG. 10 is a schematic plan view of an alternative induction heating structure of the present invention.
Figure 11:
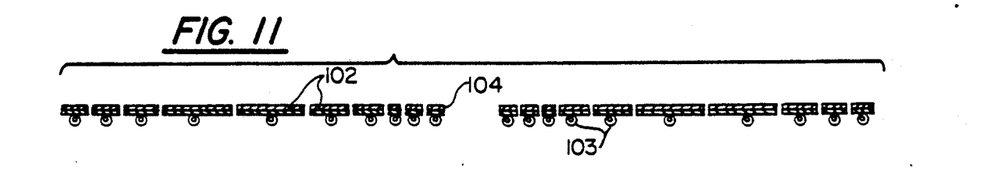
FIG. 11 is an enlarged sectional view showing more details with respect to the construction of the heating structure of FIG. 10.
Figure 12:
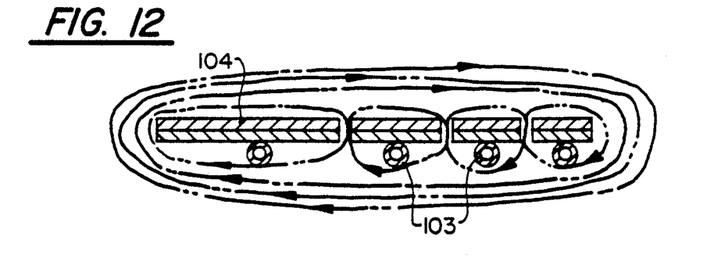
FIG. 12 is an enlarged sectional view of a number of the turns of the heating structure of FIGS. 10 and 11, illustrating magnetic flow lines.

An alternative design of inductive heating structure is illustrated in FIGS. 10 through 12. Instead of the induction coil 101 simply being a water cooled spiral as previously described, it includes an elongated solid copper plate arranged into a spiral. The width of the individual adjacent coil turns 102 is varied to tailor the induced magnetic field for uniform susceptor heating. As can be seen from the plan view of FIG. 10, this width variation is simply achieved by varying the width of the elongated plate which forms the spiral. That is, whereas standard arrangements accomplish the adjustment of coupling power to various parts of a susceptor by adjusting the spacing between the separate coil turns of the inductive heater and the susceptor, such adjustment can be accomplished in the instant invention by adjusting the coil to be effectively wider or narrower to thereby reduce or raise, respectively, the energy coupling. Although as illustrated the space between the adjacent coils is maintained uniform, i.e., less than or equal to ⅛ inch, such spacing also can be varied to aid in tailoring the induced magnetic field. However, care must be used to avoid arcing voltage between adjacent turns.

Water tubing 103 is secured in thermal conductive relationship to the plate coil as illustrated.

This construction enables the field to be tailored for uniform susceptor heating without the necessity of providing different spacings between inductor coil turns and a susceptor as is done conventionally. FIG. 12 shows a magnetic flux line pattern representing a magnetic field that can be achieved with this particular arrangement. It is achievable even though the distance between the susceptor to be heated and the plate coil turns 102 is maintained constant. It will be appreciated, though, that this solid coil inductor approach can be used, if desired, in an arrangement in which the distance between the susceptor and the various coil turns is varied. Moreover, it may be desirable to vary the spacing between adjacent coils.

The alternative inductive structure of FIGS. 10 through 12 has another feature. A coating or layer 103 of a thermally reflective material, such as silver, is placed on the surfaces of the coil turns facing the susceptor. The result is that any thermal energy radiated from the susceptor toward the coil will be reflected back into the susceptor, thus limiting energy consumption.

The advantages of the epitaxial reactor system of the present invention include: the production of epitaxial wafers which are free of slip due to the reduction in the thermal gradient across the wafers. Purge rates are three to four times faster than the prior art system employing the relatively large bell jars. Moreover, the power consumption of the epitaxial reactor is reduced from approximately 140 kilowatts to 40 kilowatts. The maintenance of the epitaxial reactor is reduced due to the purge of the R.F. coil which would otherwise become coated with the silicon component of the reactive gases. The vacuum pull-down on the clamping and sealing ring structure 18 produces less stress in the bell jar and makes the bell jar less subject to cracking and failure. In addition, the initial cost of the bell jar is substantially reduced as contrasted with the prior art. The cylindrical shield 88 protects the operator from catastrophic failure of the bell jar cover 17 under all operating conditions.

What is claimed is:

1. In an inductively heated pancake epitaxial reactor for processing wafers by depositing a film of epitaxial material on the wafers:

pancake susceptor means for holding the major faces of the wafers to be processed generally in a horizontal plane for transferring heat to the wafers;

inductive heater means for heating said susceptor means and wafers as held by said susceptor to an elevated deposition temperature by radio frequency induction;

bell jar means for enclosing said susceptor means and the wafers to be processed and for controlling the atmosphere in a deposition zone defined within said bell jar means and overlaying the wafers being processed;

gas distribution means for feeding reactant gases into said deposition zone along a flow path generally radially directed of said pancake susceptor means;

said gas distribution means including a plurality of tubes with their longitudinal axes being generally vertically oriented for feeding said reactant gases into the deposition zone overlaying said wafers;

deflector means disposed proximate the open upper end of at least one of said tubes of said gas distribution means for imparting a substantial radial component of velocity to at least a portion of the flow of reactant gases inducted into said deposition zone, said tubes being coaxial and said deflector means comprising a radially flared flange carried upon one of said coaxial tubes and said flange overlaying the open upper end of another one of said coaxial tubes; and flow control means for feeding said gases through said plurality of tubes at different controlled flow rates, whereby control of the deposition is obtained by control of the respective reactant gases through respective ones of said plurality of tubes.

2. In an inductively heated pancake epitaxial reactor for processing wafers by depositing a film of epitaxial material on the wafers:

pancake susceptor means for holding the wafers to be processed with their major faces disposed generally in a horizontal plane and for transferring heat to wafers;

inductive heater means for heating said susceptor means and wafer as held by said susceptor means to an elevated deposition temperature by radio frequency induction;

bell jar means for enclosing said susceptor means and the wafers to be processed and for controlling the atmosphere in a deposition zone defined within said bell jar means and overlaying the wafers being processed;

gas distribution means for flowing reactant gases through said bell jar means and said deposition zone along a flow path including a passageway portion generally centrally disposed of said pancake susceptor means;

said inductive heater means including an electrically conductive coil structure to be driven with radio frequency current for inductively heating said susceptor means;

purge housing means for enclosing structure within said bell jar means so as to generally partition the atmosphere within said purge housing means from the remaining atmosphere within said bell jar means, said coil structure being disposed within said purge housing means and said purge housing means including a refractory dielectric annular top cover wall portion disposed overlaying the top of said coil structure, a refractory dielectric annular bottom wall portion disposed underlying said coil structure, and refractory dielectric inner and outer axially directed tubular wall portions disposed at the inner and outer peripheries respectively of said annular top cover wall portion and extending below said top cover portion; and purge gas supply means for feeding a flow of purge gas generally free of film deposition reactant gases into said purge housing means and for elevating the gas pressure within said purge housing means relative to that of said deposition zone for inhibiting the deposition of film materials on said structure within said purge housing means.

3. The epitaxial reactor of claim 2 wherein said outer axially directed tubular wall portion of said purge housing means rests on the upper surface of said annular bottom wall portion.

4. The epitaxial reactor of claim 2 wherein said purge housing means further includes a second inner refractory dielectric tubular wall portion which is disposed generally at the inner periphery of said annular top cover wall portion with said second inner tubular wall portion surrounding said first inner tubular wall portion in radially spaced relation therefrom and said second inner tubular wall portion being upstanding from said annular bottom wall portion.

5. The epitaxial reactor of claim 2 wherein said purge housing means further includes a which is disposed generally at the outer periphery of said annular top cover wall portion with said first outer tubular wall portion surrounding said second outer tubular wall portions and said second outer wall portion being upstanding from said annular bottom wall portion and radially inwardly spaced from said first outer tubular wall portion.

6. The epitaxial reactor of claim 2 wherein said inner tubular wall portion includes a portion radially inwardly spaced from and depending below said bottom annular wall portion for directing purge gas exiting from said purge housing means below said purge housing means.

7. In an inductively heated pancake epitaxial reactor for processing wafers by depositing a film of epitaxial material on the wafers;

pancake susceptor means for holding the wafer to be processed with their major faces disposed generally in a horizontal plane and for transferring heat to wafers;

inductive heater means for heating said susceptor means and wafers as held by said susceptor means to an elevated deposition temperature by radio frequency induction;

bell jar means for enclosing said susceptor means and the wafers to be processed and for controlling the atmosphere in a deposition zone defined within with bell jar means and overlaying the wafers being processed;

gas distribution means for flowing reactant gases through said bell jar means and said deposition zone along a flow path including a passageway portion generally centrally disposed of said pancake susceptor means;

said inductive heater means including an electrically conductive coil structure to be driven with radio frequency current for inductively heating said susceptor means;

a member of porous thermally insulative material interposed between said susceptor means and said electrically conductive coil structure for inhibiting the loss of heat by heat transfer from said susceptor to said coil structure;

purge housing means for enclosing structure within said bell jar means so as to generally partition the atmosphere within said purge housing means from the remaining atmosphere within said bell jar means; and purge gas supply means for feeding a flow of purge gas generally free of film deposition reactant gases into said purge housing means and for elevating the gas pressure within said purge housing means relative to that of said deposition zone for inhibiting the deposition of film materials on said structure within said purge housing means.

8. The epitaxial reactor of claim 7 wherein said member of porous thermally insulative material is disposed within said coil housing means for purging by the flow of purge gas flowing therein.

9. The epitaxial reactor of claim 8 wherein said member of porous thermally insulative material comprises a blanket of refractory fibers said blanket having a density falling within the range of three to twenty pounds per cubic foot.

10. In an inductively heated pancake epitaxial reactor for processing wafers by depositing a film of epitaxial material on the wafers:

pancake susceptor means for holding the wafers to be processed with major faces thereof disposed generally in a horizontal plane and for transferring heat to the wafer;

inductive heater means for heating said susceptor means and wafers as held by said susceptor means to an elevated deposition temperature by radio frequency induction;

bell jar means for enclosing said susceptor means and the wafers to be processed and for controlling the atmosphere in a deposition zone defined within said bell jar means and overlaying the wafers being processed;

gas distribution means for flowing reactant gases through said bell jar means and said deposition zone along a flow path including a passageway portion generally centrally disposed of said pancake susceptor means;

said inductive heater means including an electrically conductive coil structure to be driven with radio frequency current for inductively heating said susceptor means;

a member of porous thermally insulative material interposed between said susceptor means and said electrically conductive coil structure for inhibiting the loss of heat by heat transfer from said susceptor means to said coil structure;

thermal insulator housing means for housing said member of thermally insulative material and for partitioning the atmosphere within said deposition zone from the atmosphere within said insulator housing; and purge gas supply means for feeding a flow of purge gas generally free of film deposition reactant gases into said thermal insulative member housing means for elevating the gas pressure within said thermal member housing means relative to that of said deposition zone for inhibiting the deposition of film materials on said member of thermally insulative material within said thermal member housing means.

11. In an inductively heated pancake epitaxial reactor for processing wafers by depositing a film of epitaxial material on the wafers:

pancake susceptor means for holding the wafers to be processed with their major faces disposed generally in a horizontal plane and for transferring heat to the wafers;

inductive heater means for heating said susceptor means and wafers to an elevated deposition temperature by radio frequency induction;

bell jar means for enclosing said susceptor means and the wafers to be processed and for controlling the atmosphere in a deposition zone defined within said bell jar means and disposed overlaying the wafers being processed;

gas distribution means for feeding reactant gases into said deposition zone;

said inductive heater means including an electrically conductive coil structure to be driven with radio frequency current for inductively heating said susceptor means;

said coil structure including a plurality of electrically conductive tubular conduits stacked vertically, one above the other, to define in each turn of said coil structure a composite electrical conductor of elongated transverse cross sectional area with the transverse axis of elongation being generally in the vertical direction; and means for flowing fluid coolant through said tubular conduits for cooling of said coil structure.

12. The epitaxial reactor of claim 11 wherein said coil structure includes a plurality of radially spaced turns, and wherein the radial spacing between turns proximate the outer periphery of said coil structure is decreased relative to the radial spacing between turns elsewhere in the coil so that the inductive heating power density coupled from said coil structure into said susceptor means is increased proximate the outer periphery of said susceptor means to offset increased conductive heat loss from said susceptor means to the flow of reactant gases proximate the outer periphery of said susceptor means.

13. The epitaxial reactor of claim 11 wherein said vertically stacked tubular conduits are bonded together to define said composite electrical conductor.

14. In an inductively heated pancake epitaxial radio reactor for processing wafers by depositing a film of epitaxial material on the wafers:

pancake susceptor means for holding the wafers with their major faces to be processed generally in a horizontal plane and for transferring heat to the wafers;

inductive heater means for heating said susceptor means and wafers as held on said susceptor means to an elevated deposition temperature by radio frequency induction;

bell jar means for enclosing said susceptor means and the wafers to be processed and for controlling the atmosphere in a deposition zone defined within said bell jar means and overlaying the wafers being processed;

gas distribution means for feeding reactant gases into said bell jar means and said deposition zone;

said bell jar means including a generally bell-shaped refractory member having open and closed ends for disposition over said susceptor means and for partitioning the atmosphere of said deposition zone from the atmosphere outside of said bell jar means;

said bell-shaped refractory member having a generally circular lip portion at its open end;

said bell jar means including a generally fixed base plate portion;

sealing flange means coupled to said lip portion of and movable with said bell-shaped member for selectively sealing said bell-shaped member to said base plate in a generally gas-tight manner; and said sealing flange means including sealing ring means of compressible material for sealing said bell-shaped member and including clamping means for compressing said sealing ring means radially inwardly into gas-tight sealing engagement with the outer periphery of said lip portion of said bell-shaped member and for mechanically coupling said sealing flange means to said bell-shaped member for movement therewith.

15. The epitaxial reactor of claim 14 wherein said sealing flange means includes an annular foot portion facing said base plate portion; and second sealing ring means including a second ring of compressible material interposed between said base plate portion and said foot portion of said sealing flange means for being selectively compressed into gas-tight sealing engagement with said foot portion of said sealing flange means and said base plate portion for selectively sealing said bell-shaped member to said base portion in a gas-tight manner.

16. The epitaxial reactor of claim 15 including:

third sealing ring means including a third ring of compressible material interposed between said base plate portion of said bell jar means and said foot portion of said sealing flange means for being selectively compressed into gas-tight sealing engagement with said foot portion of said sealing flange means and said base plate portion for selectively sealing and defining a vacuum hold down region of space between said second and third sealing ring means; and evacuating means for selectively evacuating said defined hold down region of space for selectively holding said sealing flange means and said bell-shaped member to said fixed base plate portion of said bell jar means.

17. The epitaxial reactor of claim 16 including a gas purge region of space defined in between said foot portion of said sealing flange means and said base plate portion of said bell jar means and disposed radially inwardly of said second sealing ring means; and purge gas supply means connected in gas communication with said gas purge region of space for supplying purge gas free of deposition reactant gas constituents to said gas purge region to inhibit deposition of material proximate said sealing ring means.

18. In an inductively heated pancake epitaxial reactor for processing wafers by depositing a film of epitaxial material on the wafers:

pancake susceptor means for holding the wafers with their major faces to be processed generally in a horizontal plane and for transferring heat to the wafers;

inductive heater means for heating said susceptor means and wafers as held by said susceptor means to an elevated deposition temperature by radio frequency induction;

bell jar means for enclosing said susceptor means and the wafers to be processed and for controlling the atmosphere in a deposition zone defined within said bell jar means and overlaying the wafers being processed;

gas distribution means for feeding reactant gases into said bell jar means and said deposition zone;

said bell jar means including a generally bell-shaped refractory member having open and closed ends for disposition over said susceptor means and for partitioning the atmosphere of said deposition zone from the atmosphere outside of said bell jar means;

reflector means including a generally bell-shaped thermal radiant energy reflecting structure disposed generally coaxially of and radially outwardly spaced from said bell-shaped refractory member for reflecting thermal radiant energy emanating from said susceptor means and wafers being processed back to said susceptor means and wafers, said reflecting structure additionally being centrally apertured at its top for flow of fluid coolant therethrough;

a plurality of generally coaxially radially spaced cylindrical vanes disposed in said central aperture of said reflecting structure;

air cooling means for flowing a stream of cooling air through a cooling annulus defined between said bell-shaped refractor member and said outwardly spaced bell-shaped reflecting structure for cooling of said bell-shaped refractory member to inhibit deposition of unwanted material on the inside surface of said bell-shaped refractory member; and a plurality of said coaxial vanes having outwardly flared lower flange portions facing into said cooling annulus for partitioning the flow of fluid coolant into a plurality of coaxial flow streams and for reflecting thermal radiant energy emanating from said susceptor means and wafers back to said susceptor means an wafers, thereby inhibiting the loss of thermal energy from the epitaxial reactor out through the central aperture in said thermal energy reflecting structure.

19. The epitaxial reactor of claim 18 wherein said cooling annulus has generally a uniform cross-sectional area as a function of axial length to inhibit formation of flow separation and eddies in the flow of fluid coolant through said cooling annulus.

20. The epitaxial reactor of claim 18 wherein the innermost one of said coaxial vanes depends further into said cooling annulus than the outermost one of said coaxial vanes to inhibit formation of a hot spot on the uppermost portion of said bell-shaped refractory member.

21. The epitaxial reactor of claim 18 wherein the inner surface of said outwardly flanged portions of said vanes are coated with gold to facilitate reflection of thermal radiant energy emanating from said susceptor means back to said susceptor means.

22. In an inductively heated pancake epitaxial reactor for processing wafers by depositing a film of epitaxial material on the wafers:

pancake susceptor means for holding the wafers with their major faces to be processed generally in a horizontal plane and for transferring heat to the wafers;

inductive heater means for heating said susceptor means and wafers as held by said susceptor means to an elevated deposition temperature by radio frequency induction;

bell jar means for enclosing said susceptor means and the wafers to be processed and for controlling the atmosphere in a deposition one defined within said bell jar means and overlaying the wafers being processed;

gas distribution means for feeding reactant gases into said bell jar means and said deposition zone;

said bell jar means including a generally bell-shaped refractory member having open and closed ends for deposition over said susceptor means and for partitioning the atmosphere of said deposition zone from the atmosphere outside of said bell jar means, the closed end of said bell-shaped member being concave and having a maximum radius of curvature in excess of the axial length of said bell-shaped member, whereby the volume of said bell jar means is reduced to facilitate economies in utilization of power and consumption of reactant and purge gases; and said bell-shaped member having a diameter at its open end greater than its axial length, whereby the volume of said bell jar means is reduced to facilitate economies in utilization of power and consumption of reactant and purge gases.

* * * * *